United States Patent
Piessens et al.

(10) Patent No.: US 6,861,902 B2
(45) Date of Patent: Mar. 1, 2005

(54) SELF OSCILLATING POWER AMPLIFIER

(75) Inventors: Tim Piessens, Leuven (BE); Michel Steyaert, Leuven (BE)

(73) Assignees: K.U. Leuven Research & Development, Leuven (BE); Alcatel, Antwerp (BE)

(*) Notice: Subject to any disclaimer, the term of this patent is extended or adjusted under 35 U.S.C. 154(b) by 174 days.

(21) Appl. No.: 10/059,439

(22) Filed: Jan. 31, 2002

(65) Prior Publication Data

US 2002/0171480 A1 Nov. 21, 2002

(30) Foreign Application Priority Data

Feb. 1, 2001 (EP) .............................. 01400257

(51) Int. Cl.⁷ .................................. H03F 1/36
(52) U.S. Cl. ............................ 330/109; 330/69
(58) Field of Search .................. 330/10, 69, 107, 330/109

(56) References Cited

U.S. PATENT DOCUMENTS

| | | | |
|---|---|---|---|
| 4,117,415 A | | 9/1978 | Hoover |
| 4,649,565 A | * | 3/1987 | Kaizer et al. ............... 330/127 |
| 6,307,431 B1 | * | 10/2001 | Botti et al. .................... 330/10 |
| 2002/0033734 A1 | * | 3/2002 | Broadley .................... 330/251 |

FOREIGN PATENT DOCUMENTS

| | | | |
|---|---|---|---|
| JP | 07272186 A | * | 10/1995 |
| WO | WO 98/19391 A2 | | 5/1998 |

OTHER PUBLICATIONS

Sherman J D: "Class D Amplifiers Provide High Efficiency for Audio Systems" EDN Electrical Design News, US, Cahners Publishing Co. Newton, Massachusetts, vol. 40, No. 11, May 25, 1995, pp. 103–106, 108, 111.

D. Su W. Mcfarland: "An IC for linearizing RF power amplifiers using envelope elimination and restoration" IEEE International Solid State Circuits Conference., Feb. 5–7, 1998, pp. 3.6–1–3.6–9, IEEE Inc. New York., NY.

* cited by examiner

*Primary Examiner*—Khanh Van Nguyen
(74) *Attorney, Agent, or Firm*—Sughrue Mion, PLLC

(57) ABSTRACT

A power amplifier includes a comparator (COMP) to which an input signal is applied, a digital buffer (BUF) coupled via a feedback low-pass filter (LPFB) to a second input terminal (Cin2) of the comparator (COMP). An unstable loop is thereby created with an oscillation frequency related to the bandwidth of the feedback low-pass filter. In the presence of an input signal this self-oscillation frequency linearizes the system resulting in a power amplifier with excellent power efficiency. In a differential version two of these self-oscillating loops are provided. The coupling of the two loops thereby withholds the high-frequency self-oscillation from the load.

5 Claims, 4 Drawing Sheets

SELF OSCILLATING POWER AMPLIFIER

BACKGROUND OF THE INVENTION

The present invention relates to a power amplifier including an input terminal for coupling to an input signal source. The amplifier arrangement further includes a comparator, a first input terminal of which is coupled to the input terminal of the amplifier arrangement, an output terminal which is coupled to an input terminal of a digital buffer, a buffer output terminal of the digital buffer is coupled to an output terminal of the amplifier arrangement and to a second input terminal of the comparator.

Such a power amplifier is already known in the art, e.g. from the article "An IC for Linearizing RF Power Amplifiers using Envelope Elimination and Restoration", by D. Su and W. McFarland, ISSCC 1998 Technical Digest, paper 3.6-2. Therein, in FIG. 2a, a circuit is shown wherein a comparator in series with a Class-D buffer and a lowpass filter is coupled to a resistive load, this circuit having a direct feedback from the output to the input of the system.

A drawback of such a circuit is that its operation is based on switch-capacitors, which obviously need to be clocked, as is clearly shown in FIG. 2b. The presence of such a high-frequency sampling clock however seriously increases the power consumption. This seriously hampers its use in especially xDSL systems, where the power consumption of the output amplifier, is a serious issue.

SUMMARY OF THE INVENTION

An object of the present invention is to provide a power amplifier of the above known type but which has a much better power efficiency compared to the prior art circuit.

According to the invention, this object is achieved due to the presence of a low-pass filter in the feedback loop of the amplifier arrangement.

In this way, by inserting a low-pass filter in the feedback path, an unstable feedback loop is created, with an oscillation frequency related to the bandwidth of this low-pass filter. This limit cycle oscillation within the loop results in the square wave at the output with this oscillation frequency. When this unstable system is forced by an external signal Vin at the input of the comparator, having a frequency lower than this self oscillation frequency, this self-oscillation or limit cycle oscillation acts as dither and linearizes the system as long as the differential or error signal between the inputs of the comparator is smaller than the limit cycle amplitude at the comparator input. The output is a square wave containing the self-oscillation frequency and the amplified forced signal. With limit cycle amplitude is meant the amplitude between the inputs of the comparator in the case no external input signal is present.

Since this amplifier is a switching type amplifier a high efficiency can be obtained, even when buffering signals with a high crest factor as in xDSL. Since, in comparison to the prior art system no clock is used, power efficiency is seriously improved.

In this way, by inserting an additional low-pass filter between the output of the amplifier arrangement and the load, the high-frequency modulation components are filtered out.

This means that the minimum self-oscillation frequency, which is mainly determined by the cut-off frequency of the low pass filter in the feedback path, merely has to be a factor 3 times larger than the bandwidth of the input signal to be amplified. In the already mentioned prior art systems, the switching or clock frequency has to be generally more than a factor 10 times larger than the bandwidth of the input signal to obtain enough suppression of the quantisation noise. This is because in the prior art system the signal is presented by a discrete amplitude, discrete time signal while in the present amplifier it is a discrete amplitude, continuous time signal. This presents an additional advantage of the present amplifier with respect to higher obtainable bandwidths.

Compared to the single-ended version, the differential structure provides power supply modulation rejection and better noise immunity. This adds to the maximum Signal to Noise ratio attainable in the present amplifier.

A gain in efficiency is obtained since the two oscillation loops are attracted towards each other. As such the main switching frequency is not transferred to the load, since it becomes common mode for the load. This again adds to the power efficiency.

By the coupling of the load via a transformer, the high frequency common mode component can completely filtered out, and the load is galvanically decoupled from the amplifier.

The presence of the capacitor improves the coupling between the two oscillation loops and leads to a better signal integrity. Furthermore the combination of this capacitor and the transformer will result in a lowering of the series impedance of the windings of the transformer coils, again improving the efficiency of the amplifier.

BRIEF DESCRIPTION OF THE DRAWINGS

The above and other objects and features of the invention will become more apparent and the invention itself will be best understood by referring to the following description of an embodiment taken in conjunction with the accompanying drawings wherein.

DETAILED DESCRIPTION OF THE INVENTION

Figure 1:
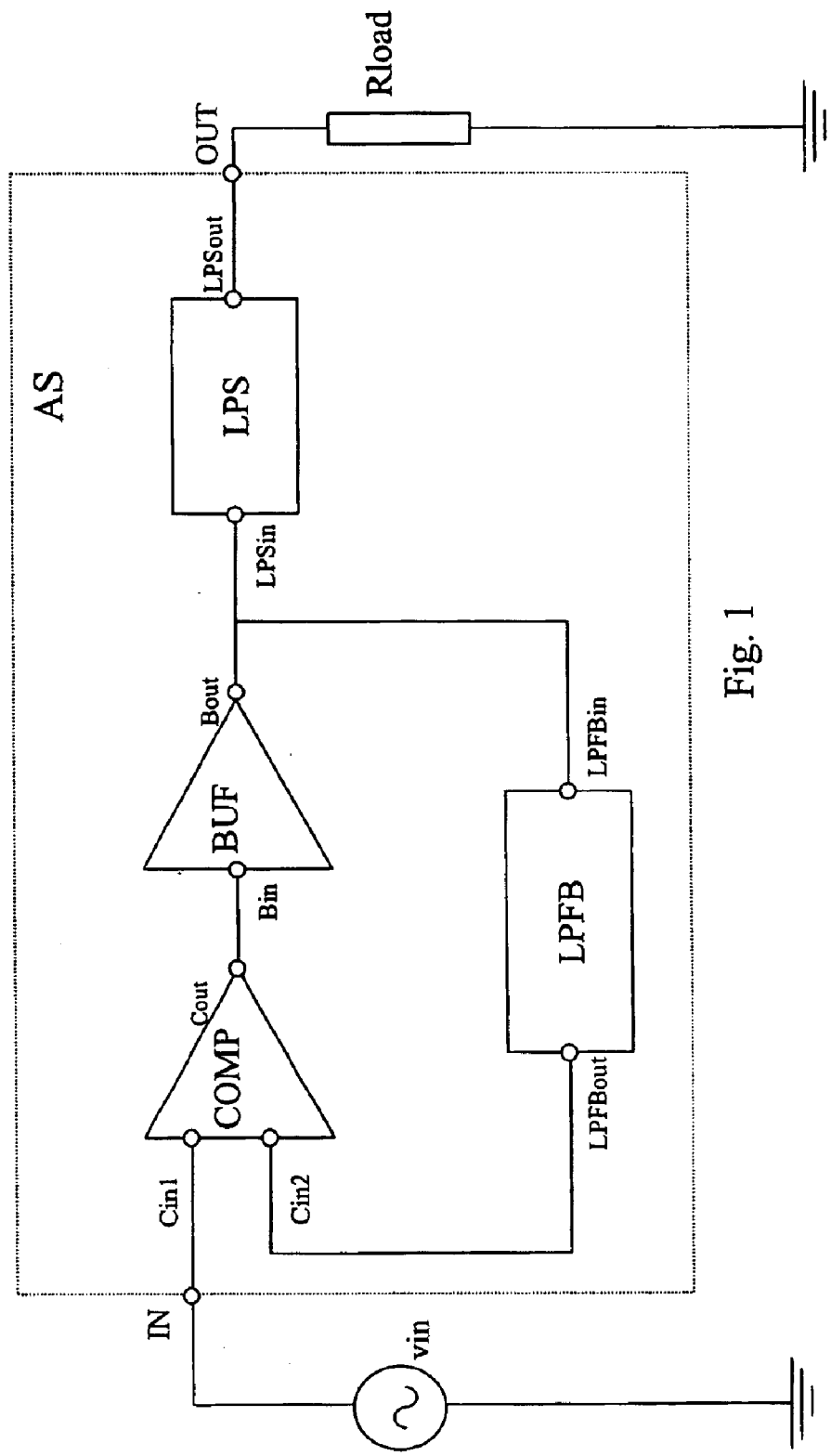
FIG. 1 represents a schematic of a single ended amplifier arrangement AS of the invention.

A single ended schematic of an output amplifier arrangement AS of the present invention is shown in FIG. 1. This amplifier arrangement includes an input terminal IN to which an input signal vin can be supplied. The input terminal IN is coupled to a first input terminal Cin1 of a comparator COMP. This comparator has a second input terminal Cin2, and is further adapted to compare input signals supplied to both input terminals with each other. The result of this comparision is delivered to the output terminal Cout of the comparator, which is further coupled to the input terminal Bin of a digital buffer BUF. The latter amplifies the digital input signal present at Bin, for delivery of the amplified signal at its output terminal Bout, which is further coupled to the output terminal OUT of the output amplifier arrangement AS. Bout is also coupled in a feedback loop to the second input terminal Cin2 of the comparator, via a feedback low-pass filter LPFB. Bout is thus coupled to input terminal LPFBin of LPFB, whereas an output terminal LPFBout of this low-pass filter is coupled to Cin2. The amplifier arrangement AS will deliver power to a load RLOAD, via the coupling of the output terminal OUT of the amplifier arrangement AS to a terminal of this load impedance. In the embodiment shown in FIG. 1 a second low-pass filter LPS is shown in between the buffer output terminal Bout and the output terminal OUT of the amplifier arrangement. The functionality of the amplifier arrangement AS will however first be explained for an embodiment without this second low-pass filter LPS.

The feedback low-pass loop filter LPFB is constructed in such a way that the loop is unstable, also in the presence of an input signal. This is realised by carefully choosing the cut-off frequency and the order of the low-pass filter such that the self-oscillation frequency, which is the frequency at which the system oscillates without an external input signal present, is at least 3 times larger than the bandwidth of the input frequency of the system. This consideration can for instance be found within tutorial handbook "Multiple-input describing functions and non-linear system design", written by A. Gelb and W. Vander Velde, Mc-Graw-Hill Book Company, 1968. In this case, the unstability is also preserved in the presence of an input signal. Therefore the loop will also oscillate, with this self-oscillation frequency, hereafter called the limit cycle frequency, in the presence of an input signal vin. In this condition the limit or oscillation cycle acts as dither and linearizes the system as long as the error signal between the two inputs of the comparator COMP is smaller than the limit cycle amplitude at the comparator input. In that case the output is a square wave containing the limit cycle frequency and the driving input signal. With limit cycle amplitude is meant the amplitude between the inputs of the comparator in the case of no external input signal present.

In order to filter out these high-frequency oscillation components, a second low-pass filter can be coupled in between the buffer output terminal Bout and the output terminal OUT of the amplifier arrangement.

The transfer function of the linearized system is dependent on the limit cycle amplitude. This can be understood from the following mathematical considerations:

The system consisting of the comparator COMP, the buffer BUF and the feedback filter LPFB, can be analyzed by making use of the describing functions approach. In this approach the comparator COMP followed by the digital buffer BUF can be modeled by the following describing function N'(A).

$$N'(A) = N(A)\frac{p_1}{s+p_1}$$

Herein p1 is the first order pole of the comparator and N(A) is a complex gain, dependent on the input amplitude A. This gain can be calculated using the following equation $$N(A) = \frac{j}{\pi A}\int_0^{2\pi} y(A\sin\psi)e^{-j\psi}d\psi$$

Which results in:

$$N(A) = \frac{2V_{DD}}{\pi A}$$

for an ideal comparator COMP and only one frequency $\omega_0$ present in the loop with an amplitude A. From this the limit cycle amplitude and frequency can be calculated, by solving the following complex equation:

$$1+N'(A)LPFB(s)=0$$

Since this is an inherent nonlinear system, these equations cannot be used to calculate the systems response on an input signal vin at the input IN. This because the superposition principle no longer holds. To analyze this a Two-Sinusoid Describing Function has been calculated.

$$N'_2(A, e) = N_2(A, e)\frac{p_1}{s+p_1}$$

N'$_2$ represents the comparator COMP by a dominant pole p1 and a complex gain N$_2$ dependent on the limit cycle amplitude A and the error signal e amplitude between cin1 and cin2 which occurs when the input signal vin is applied at the input IN. This complex amplitude can be calculated as follows:

$$N_2(A, e) = \frac{j}{\pi e}\int_{-\infty}^{\infty} F(y(x))J_0(A, u)J_1(e, u)du$$

with F(y(x)) being the Fourier Transform of the DC transfer characteristic y(x) of the comparator. J0 is the Bessel function of the first kind of order 0. J1 is the Bessel function of the first kind of order 1. Solving this equation using the Fourier transform of an ideal comparator:

$$F(y(x)) = \frac{V_{DD}}{ju}$$

yields $$N_2(A, e) = \begin{cases} \frac{V_{DD}}{\pi e}\left(\frac{e}{A}\right){}_2F_1\left(\frac{1}{2}, \frac{1}{2}; 2; \left(\frac{e}{A}\right)^2\right) & \text{for } 0 < e < A \\ \frac{2V_{DD}}{\pi e}{}_2F_1\left(\frac{1}{2}, -\frac{1}{2}; 1; \left(\frac{A}{e}\right)^2\right) & \text{for } 0 < A < e \end{cases}$$

$$\approx N(A)/2 \quad \text{when } 0 < e <<< A$$

With $_2F_1$ the hypergeometric function with a second order nominator and a first order denominator. When e<A, $_2F_1$ becomes 1, making the transfer function independent on the inputsignal, thus lowering the distortion. This equation puts a limit on the maximum output voltage when a certain distortionlevel is required.

The transfer function of the complete system consisting of COMP, BUF and LPFB thus becomes:

$$T(s) = \frac{N'_2(A, e)}{1+N'_2(A, e)LPFB(s)}$$

From this one can suggest self-adaptivity to the system. Since a changing load condition, affects the input-output characteristic of the digital driver, the limit cycle amplitude and frequency is changed. However since the transfer function of LPFB is not affected the transfer function of the complete system for a forced signal is not changed.

Since it also became clear that the limit cycle amplitude depends on the load coupled to the digital buffer, the complete system becomes self-adaptive to load variations. This effect becomes less pronounced in the presence of an extra low-pass filter LPS for filtering out the self-oscillation frequency.

Figure 2:
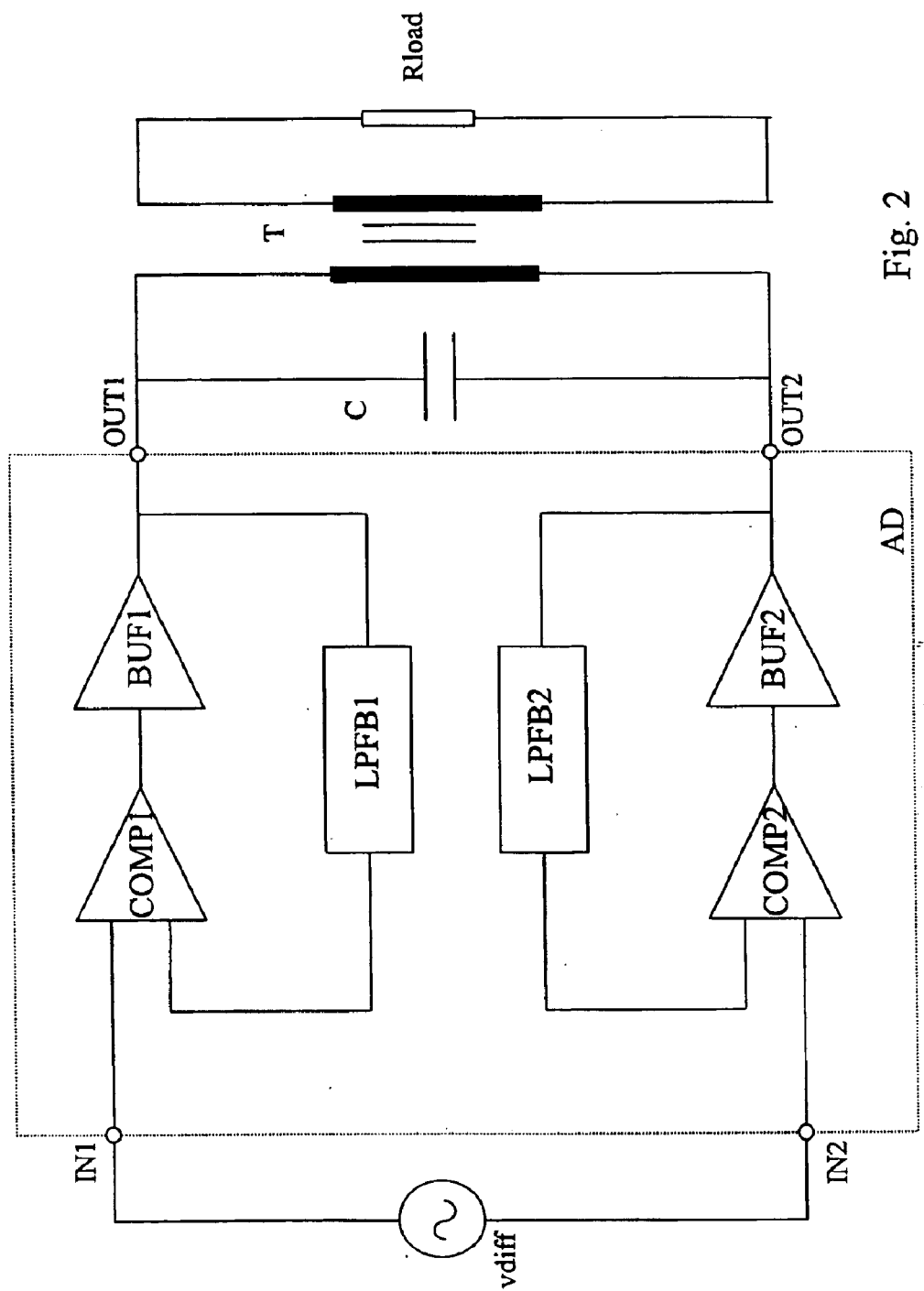
FIG. 2 represents a schematic of a differential amplifier arrangement AD of the invention, and FIG. 3 gives a transistor level embodiment of the different blocks shown in FIG. 1 and FIG. 2.

FIG. 2 shows the differential version of the amplifier arrangement of the present invention. This embodiment mainly consists of two similar loops as described in the first embodiment: a first loop consisting of comparator COMP1, digital buffer BUF1 and low-pass filter LPFB1, and a second loop consisting of comparator COMP2, digital buffer BUF2 and low-pass filter LPFB2. The first loop is coupled to a first differential input terminal IN1 of the differential amplifier arrangement AD, whereas the second loop is coupled to a second differential input terminal IN2 of the differential amplifier arrangement AD. In between both differential input terminals IN1 and IN2, a differential input signal vdiff, can be applied. The differential power amplifier arrangement AD includes a pair of differential output terminals: OUT1 and OUT2, to which the two terminals of the load impedance RLOAD can be coupled. Both loops contain similar components such that the limit cycle oscillation frequencies of both loops are the same The operation of this differential version AD is similar to the operation of the single-ended version AS, in the sense that both individual loops will oscillate at the same limit cycle oscillation frequency. Also in this case the bandwidth of the input signal has to be at least a factor 3 times smaller than the self-oscillation frequency of the loops.

By means of the coupling of the two oscillation loops via the load, the oscillators are attracted towards each other, forcing the limit cycles to oscillate in phase. Therefore merely the amplified input signal is transferred to the load, while the high frequency oscillation is withheld from this load. The differential structure thus provides power supply modulation rejection. Since the limit cycle frequency is not transferred to the load, there is no need to add an additional low-pass filter in series, as was the case for the single-ended embodiment of FIG. 1.

The attraction between both oscillation loops may be enforced by the presence of an inductive coupling, such as realised by means of a transformer T in parallel with the load, as is also shown in FIG. 2. In that way the limit cycle will become common mode for the primary winding of the transformer. Since this is decoupled from the load by the transformer itself, common mode rejection ratio is improved. Noise immunity is thereby improved. It is to be noted that for applications of DSL output amplifiers, such transformers are present for decoupling the line, such that they do not need to be separately provided.

A capacitor C can also be coupled between the two differential output terminals, as is also shown in FIG. 2. A capacitor has the advantage of providing a low impedance, which facilitates the attraction between the two loops. In combination with the aforementioned transformator T this capacitor will reduce the high inherent impedance of the transformator.

Figure 3:
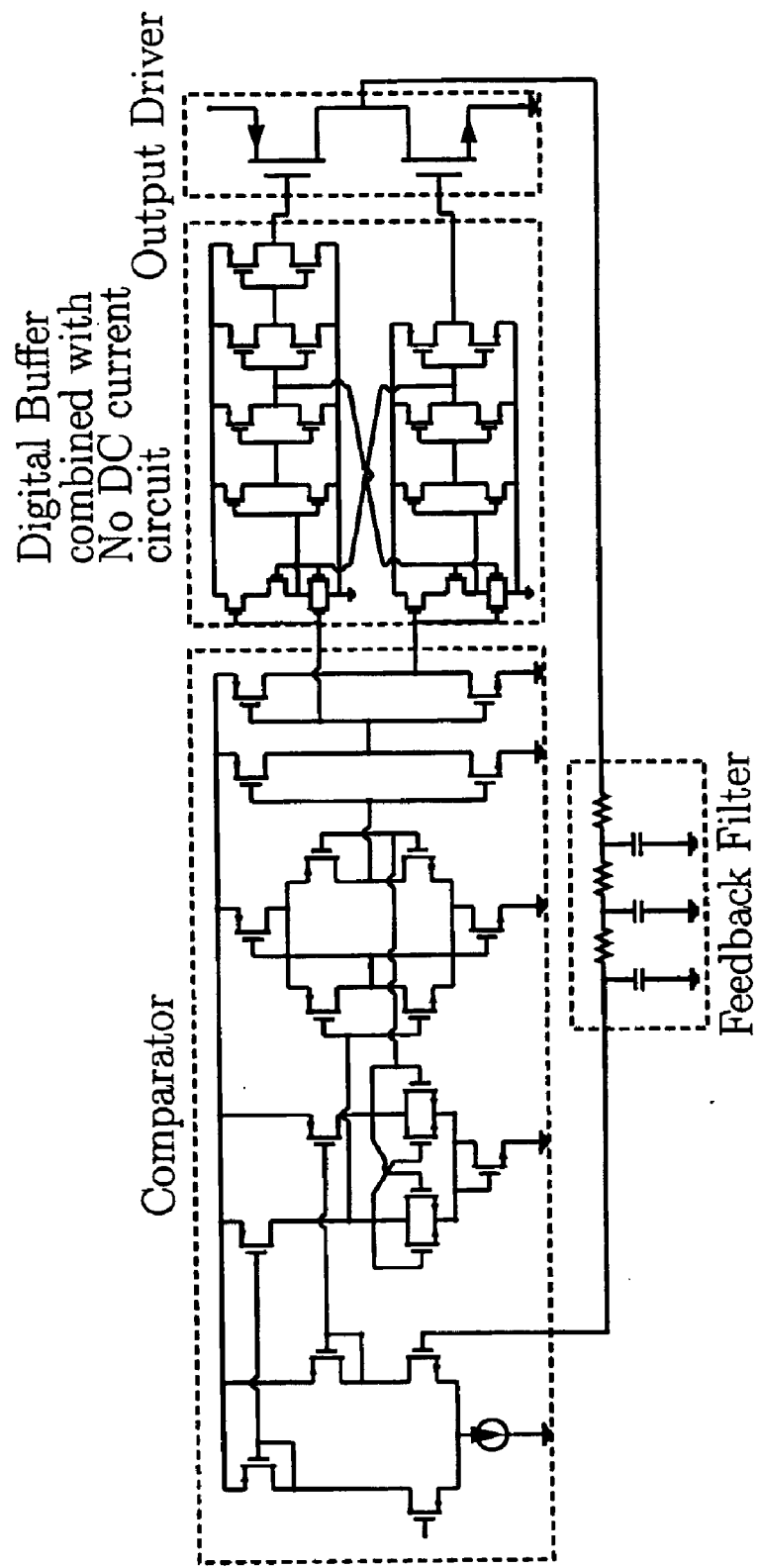

FIG. 3 shows detailed embodiments at transistor level of the different components of FIGS. 1 and 2. The loop filters LPFB, LPFB1 and LPFB2 have been realised as a third order RC filter, denoted "feedback filter" on FIG. 3, for keeping a high linearity in the feedback circuitry. To reduce the transfer time through the comparator a 3-stage structure has been chosen for COMP, COMP1 and COMP2, using positive feedback to ensure a rapid comparison followed by a self-biasing post amplifier. This is all contained in the block denoted "Comparator" in FIG. 3. To prevent large shoot-through currents during switching a non-overlapping switching circuit was added. The delay of this non-overlapping signal scheme is combined with a digital buffer to reduce the rise time of the large output driver. The transistors contained in the block denoted "digital buffer combined with no DC current circuit" together with those in the block "output driver" all form together an embodiment of the digital buffer BUF of FIG. 1 and of BUF1 and BUF2 of FIG. 2.

As can be seen from FIG. 3, this amplifier can be realised using CMOS technologies. In a particular embodiment for realising the scheme of FIG. 2, the circuits of FIG. 3, implemented in a 0.35 $\mu$m CMOS technology, an standard transformer T and a standard coupling capacitor C, were used. This complete circuit has been proven feasible to drive any load down to 2.4 Ohm. This is important with respect to the scaling of technology. Indeed, when used as DSL output amplifier, the signal levels on the line tend to remain the same magnitude (15 V), while the supply voltage drops with every technology generation. Transformers are used to overcome this problem and to make a galvanic isolation. Yet the resistance is then decreased by the square of the transformer ratio.

For a supply voltage of 3.3 V, a resistive load of 2.4 Ohm, a linear audiocapacitor of 40 nF and a ADTT1-6 transformer with a ratio of 1:1, an output voltage of 1.2 V peak-to-peak, a voltage gain of 0.9 and an efficiency of 48% were obtained for an input signal of 1.3 V peak-to-peak. It has to be noted that this efficiency includes the losses of the used transformer. If the transformer losses are calibrated out, an efficiency of 61% is achieved. It is important to notice that the efficiency drops sub-linear, resulting in a better efficiency than that of an ideal class B amplifier for input signals with a crest factor higher than 1.2.

Figure 4:
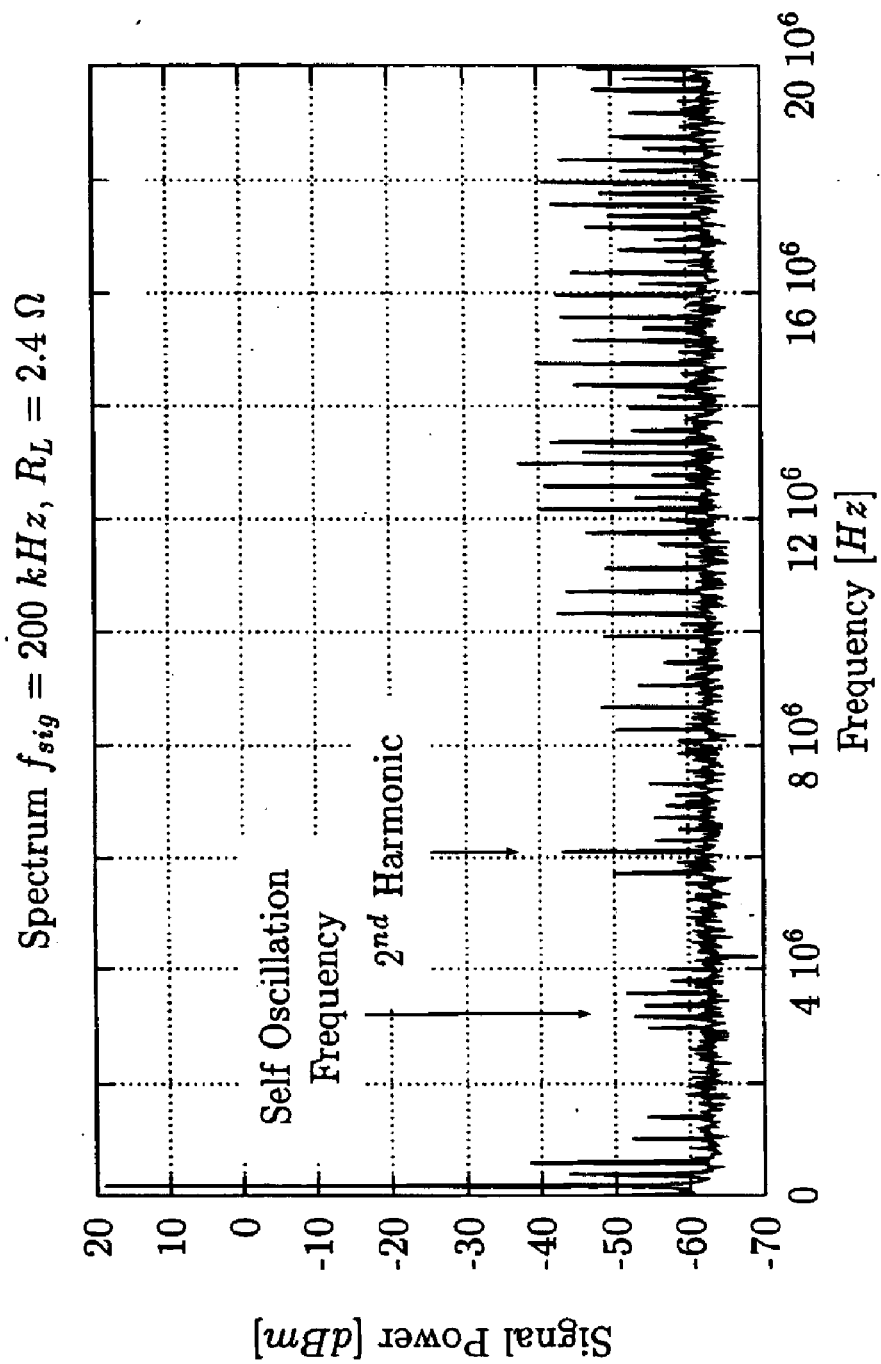
FIG. 4 represents the output spectrum measured on a differential structure as in FIG. 2, using embodiments of the building blocks as in FIG. 3.

FIG. 4 shows the output spectrum up to 20 MHz, of the thus realised differential amplifier structure with transformer and coupling capacitor. An input signal of 200 kHz was applied. The self-oscillation frequency was equal to 3.8 MHz. From this figure it is clear that due to the coupling of both loops the self-oscillation frequency and its harmonics are suppressed. This figure hardly changes for higher signal frequencies up to about 1 MHz. For a 800 KHz input signal a 54.4 dB spurious free dynamic range, abbreviated with SFDR is measured. For a 900 kHz input signal, the SFDR has decreased to a level of 51.2 dB. For higher signal frequencies the linearizing effect drops drastically, since in that case the condition stating that the bandwidth of the input signal has to be at least three times smaller than the self-oscillating frequency, is no longer fulfilled.

While the principles of the invention have been described above in connection with specific apparatus, it is to be clearly understood that this description is made only by way of example and not as a limitation on the scope of the invention, as defined in the appended claims.

What is claimed is:

1. A differential power amplifier arrangement comprising a pair of differential input terminals to which a differential input voltage can be applied, and a pair of differential output terminal for coupling to a load said differential power amplifier arrangement comprising a first self-oscillating loop with an input terminal coupled to a first one of said pair of differential input terminals, said first self-oscillating loop including a first comparator coupled to a first digital buffer, an output terminal of which is coupled to a second input terminal of said first comparator via a first low-pass filter, said differential power amplifier arrangement incuding a second self-oscillating loop with an input terminal coupled to a second one of said pair of differential input terminals, said second self-oscillating loop comprising a second comparator coupled to a second digital buffer, an output terminal of which is coupled to a second input terminal of said second comparator via a second low-pass filter.

2. A differential power amplifier arrangement according to claim 1, wherein said first self-oscillating loop is substantially identical to said second self-oscillating loop.

3. A differential power amplifier arrangement according to claim 2, wherein the bandwidth of said differential input signal is at least three times smaller than the self-oscillating frequency of said differential power amplifier arrangement.

4. A differential power amplifier arrangement according to claim 1, wherein said load is coupled to said pair of differential output terminals via a transformer, a primary winding of which is coupled between said pair of differential output terminals, a secondary winding of which is coupled in parallel to said load.

5. A differential power amplifier arrangement according to claim 1, wherein said load is coupled in parallel with a capacitor, which is coupled between said pair of differential output terminals.

* * * * *